(12) United States Patent
Ptacek et al.

(10) Patent No.: US 12,719,469 B2
(45) Date of Patent: Aug. 25, 2026

(54) DIRECT DRIVE CASCODED SWITCHING CIRCUIT

(71) Applicant: SEMICONDUCTOR COMPONENTS INDUSTRIES, LLC, Scottsdale, AZ (US)

(72) Inventors: Karel Ptacek, Roznov pod Radhostem (CZ); Roman Radvan, Roznov pod Radhostem (CZ)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 84 days.

(21) Appl. No.: 19/016,239

(22) Filed: Jan. 10, 2025

(65) Prior Publication Data

US 2026/0205107 A1 Jul. 16, 2026

(51) Int. Cl.
*H03K 17/16* (2006.01)

(52) U.S. Cl.
CPC .................................. *H03K 17/161* (2013.01)

(58) Field of Classification Search
CPC .................................................... H03K 17/161
See application file for complete search history.

(56) References Cited

U.S. PATENT DOCUMENTS 8,228,114 B1 7/2012 Cilio
9,083,343 B1 7/2015 Li et al.
9,705,489 B2 * 7/2017 van Otten ............ H03K 17/163
11,705,803 B1 7/2023 Han
2005/0258458 A1 11/2005 Wang
2014/0027785 A1 1/2014 Rose
2024/0243665 A1 * 7/2024 Pala ..................... H03K 17/687
2025/0055422 A1 * 2/2025 Yang ................... H03K 17/102

FOREIGN PATENT DOCUMENTS

DE 102015114371 A1 3/2016
EP 3001563 B1 2/2019
EP 3472905 B1 9/2020
WO 2013011289 A2 1/2013

* cited by examiner

*Primary Examiner* — Daniel C Puentes
(74) *Attorney, Agent, or Firm* — Slayden Grubert Beard PLLC

(57) ABSTRACT

A cascoded switch system is disclosed. The cascoded switch system includes JFET and a MOSFET coupled in series between a drain terminal and a source terminal. The system further includes a drive circuit comprising a JFET driver configured to receive an input signal and to output a JFET-drive signal to a capacitor coupled in series with the gate of the JFET, a switch coupled between the gate of the JFET and the source terminal and configured to be responsive to the input signal, and a comparator to compare a JFET gate voltage against a threshold. The drive circuit further includes a MOSFET driver circuit to drive the MOSFET in a MOSFET on-state during an on-state of the input signal, and drive the MOSFET in one of a MOSFET off-state and the MOSFET on-state in response to a comparison signal from the comparator during an off-state of the input signal.

20 Claims, 4 Drawing Sheets t1
t2
IN VOLTS (V)
5.0 4.0 3.0 2.0 1.0 0.0
JDRIVE VOLTS (V)
12.5 7.5 2.5
VSUPPLY
JGATE VOLTS (V)
0.0 -4.0 -8.0 -12.0
JGATE_COMP VOLTS (V)
5.0 4.0 3.0 2.0 1.0 0.0
MDRIVE VOLTS (V)
4.0 2.0 0.0
5.0 10.0 15.0 20.0 25.0 30.0 35.0 40.0 45.0 50.0 55.0 60.0 65.0 70.0 75.0 80.0 85.0 90.0 95.0
TIME (µs)

DIRECT DRIVE CASCODED SWITCHING CIRCUIT

TECHNICAL FIELD

The disclosure relates generally to integrated circuit technology, and particularly to switching circuits.

BACKGROUND

Power electronics may be used to control the conversion and distribution of electric power. For example, switching power converters may be used to create a direct current ("DC") voltage from an alternating current ("AC") voltage by switching current through a magnetic element such as an inductor. Conversely, inverters can be used to convert a DC voltage to an AC voltage. In these and other forms of power electronics, power switches may be used to control the conversion and flow of power through the power-conversion system and to the electronic circuitry to be powered by the device.

Cascoded switches may be used as the power switch in power conversion systems to drive high currents and to withstand large voltages. Inventors of embodiments of the present disclosure have recognized that cascoded switches may suffer from unstable oscillations and drain-voltage overshoots due to inductive loads and the turn-off characteristics of the cascoded switch. Inventors of embodiments of the present disclosure have also recognized that such drain-voltage overshoots may damage the components of the cascoded switch unless otherwise constricted with an additional and costly R-C snubber across the drain to source of the cascoded switch. Embodiments of the present disclosure may address one or more of these challenges.

BRIEF DESCRIPTION OF THE DRAWINGS

A more complete understanding of the present embodiments may be acquired by referring to the following description taken in conjunction with the accompanying drawings, in which like reference numbers indicate like features.

DETAILED DESCRIPTION

Details of one or more embodiments are set forth in the description below and the accompanying drawings. Other features will be apparent from the description, drawings, and from the claims. The embodiments disclosed should not be interpreted, or otherwise used, as limiting the scope of the disclosure, including the claims. In addition, one skilled in the art understands that the following description has broad application, and the discussion of any embodiment is meant to be exemplary of that embodiment, and not intended to intimate that the scope of the disclosure, including the claims, is limited to that embodiment.

Various terms are used to refer to particular system components. Different companies may refer to a component by different names, and this disclosure does not intend to distinguish between components that differ in name but not form and function. In the following discussion and in the claims, the terms "including" and "comprising" are used in an open-ended fashion, and thus should be interpreted to mean "including, but not limited to." Also, the term "couple" or "coupled" is intended to mean either an indirect or direct connection. Thus, if a first device couples to, or is coupled to, a second device, that connection between the first device and the second device may be through a direct connection or through an indirect connection via other devices and connections.

Figure 1:
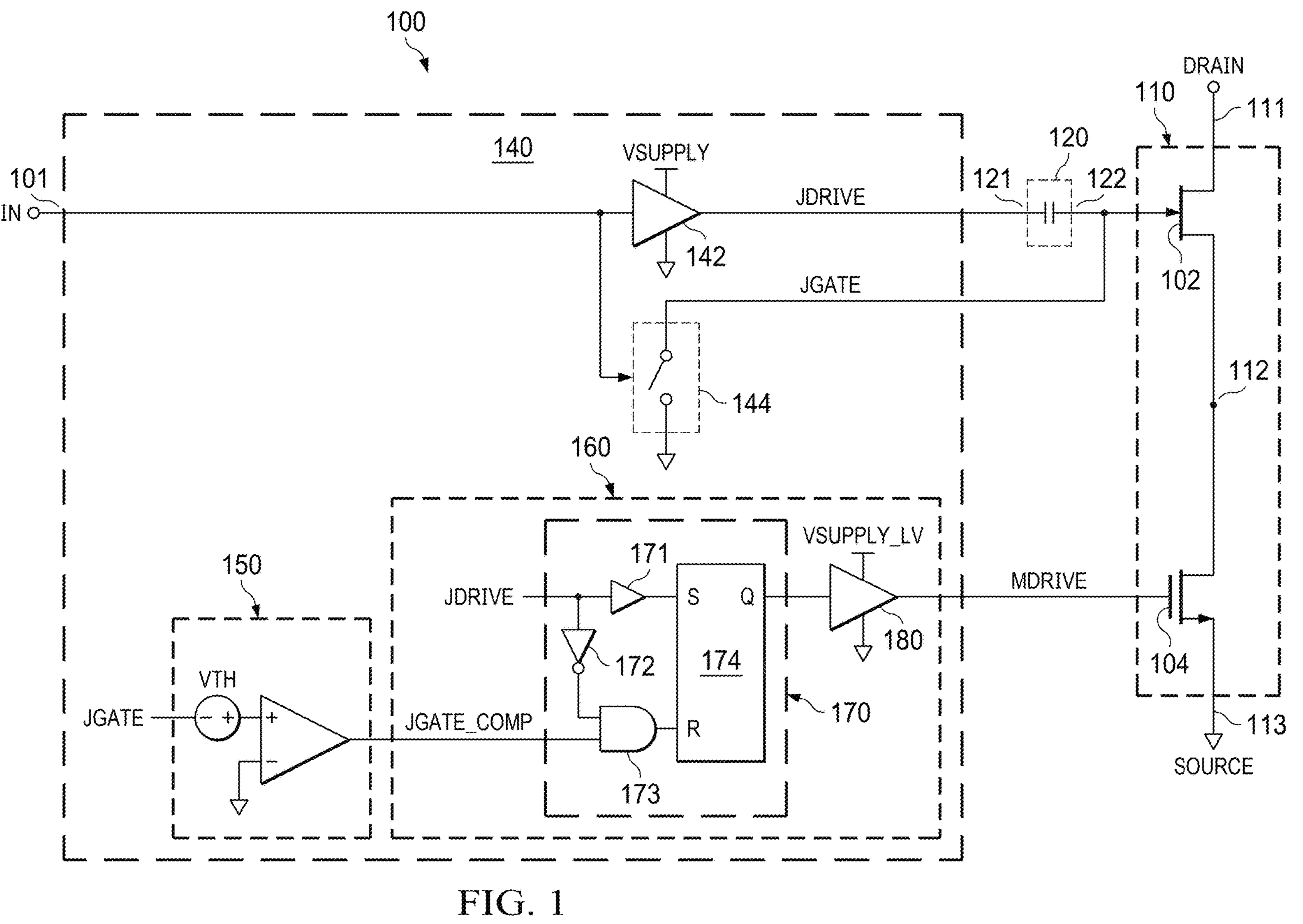
FIG. 1 illustrates a schematic diagram of a cascoded switch system in accordance with embodiments of the present disclosure.

FIG. 1 illustrates a schematic diagram of cascoded switch system 100 in accordance with embodiments of the present disclosure. Cascoded switch system 100 may be implemented in suitable fashion according to the operation described in the present disclosure. In some embodiments, cascoded switch system 100 may include cascoded switch 110, capacitor 120, and drive circuit 140. As described in further detail below, drive circuit 140 may be configured to drive cascoded switch 110 in response to an input signal IN.

Cascoded switch 110 may include junction field-effect transistor ("JFET") 102 and metal-oxide semiconductor field effect transistor ("MOSFET") 104. As shown in FIG. 1, JFET 102 may be coupled between a drain terminal 111 and a cascode node 112 of cascoded switch 110. For example, JFET 102 may have a drain coupled to the drain terminal 111 of cascoded switch 110, and may have a source coupled to the cascode node 112. JFET 102 may be a depletion-mode device that may be normally on with a gate-to-source voltage of zero volts, and driven off with a gate-to-source voltage below a threshold of, for example, −4 volts, −6 volts, −8 volts, −12 volts, or less. For the purposes of illustration, embodiments of JFET 102 are described below with an gate-to-source threshold of, for example, −12 volts. MOSFET 104 may be coupled between the cascode node 112 and the source terminal 113 of cascoded switch 110. For example, MOSFET 104 may have a drain coupled to the source of JFET 102 at the cascode node 112, and may have a source coupled to the source terminal 113 of cascoded switch 110. MOSFET 104 may be an enhancement-mode device that may be normally off with a gate-to-source voltage of zero volts, and driven on with a gate-to-source voltage above a positive threshold.

Cascoded switch 110, and cascoded switch system 100 as a whole, may be utilized in either high-side and low-side switching applications. For example, in a half-bridge circuit application, a first instance of cascode switch system 100 may form a high-side switch of the half-bridge circuit and a second instance of cascode switch system 100 may form a low-side switch of the half-bridge circuit. The internal circuitry of drive circuit 140 may be referenced from the source terminal 113, which may serve as the low-voltage supply rail for cascoded switch 110 and drive circuit 140. For example, as shown in FIG. 1, the internal circuitry of drive circuit 140 such as JFET driver 142, switch 144, and driver 180, may be referenced from the source terminal 113. In embodiments where cascoded switch system 100 serves as a low-side switch, source terminal 113 may be coupled to ground, and the internal circuitry of drive circuit 140 may thus be referenced to ground. And in embodiments where cascoded switch system 100 serves as a high-side switch, source terminal 113 may be coupled to a floating switching node, and the internal circuitry of drive circuit 140 may thus be referenced to the floating switching node. For either such low-side or high-side applications, a supply voltage VSUPPLY may also be supplied to the internal circuitry of drive circuit 140 at a voltage level sufficiently above the voltage of source terminal 113 to supply drive circuit 140 and to drive JFET 102 and MOSFET 104.

In some embodiments, MOSFET 104 may be an N-type MOSFET ("NMOS" or "NMOS transistor"). Further, MOSFET 104 may in some embodiments be a silicon MOSFET formed on a silicon substrate. MOSFET 104 may also be implemented in other semiconductor technologies, including silicon-carbide ("SiC") or Gallium-Arsenide ("GaN"). JFET 102 may in some embodiments be a silicon carbide JFET formed on a silicon carbide substrate. JFET 102 may also be formed in any other semiconductor technology suitable for producing a JFET with current-density and voltage stand-off properties suitable to serve as a cascode for a lower-voltage rated MOSFET. Further, in some embodiments, JFET 102 and MOSFET 104 may be co-packaged in a multi-die integrated circuit package. For example, JFET 102 may be implemented as a silicon carbide JFET, MOSFET 104 may be implemented as a silicon MOSFET 104, and the silicon-carbide-based die and the silicon-based die on which JFET 102 and MOSFET 104 are respectively implemented may be co-packaged together in a multi-die integrated circuit package. Further, in some embodiments, JFET 102, MOSFET 104, and drive circuit 140 may be co-packaged in a multi-die integrated circuit package, along with or separate from capacitor 120.

Drive circuit 140 may be configured, in conjunction with capacitor 120, to drive JFET 102 and MOSFET 104 in response to an input signal IN received at input terminal 101. In some embodiments, the input signal IN may be a pulse-width modulated (PWM) input signal for turning on and off cascoded switch 110. Depending on the application, drive circuit 140 may be configured to receive a input signal whereby the logic-high level represents a turn-on command and a logic-low level represents a turn-off command, or vice versa whereby a logic-low level represents a turn-on command and a logic-high level represents a turn-off command. For the purposes of illustration, the embodiments below describe a logic-high level of the input signal IN as representing a turn-on command or an on-state of the input signal IN, and describe a logic-low level of the input signal IN as representing a turn-off command or an off-state of the input signal IN.

Drive circuit 140 may be implemented in any suitable fashion according to the operation described in the present disclosure. As shown in FIG. 1, drive circuit 140 may include JFET driver 142, switch 144, comparator 150, and MOSFET driver circuit 160.

JFET driver 142 may be configured to receive the input signal IN and to output a JFET-drive signal JDRIVE to capacitor 120 coupled in series between JFET driver 142 and the gate of JFET 102. When the input signal IN is at a logic-high level (on-state), JFET driver 142 may output a high JFET-drive signal JDRIVE at the level of the voltage supply VSUPPLY. In some embodiments, VSUPPLY may be for example, +8 volts, +12 volts, +15 volts, or more, relative to the voltage at source terminal 113, and depending on the gate thresholds of JFET 102 and/or MOSFET 104. For the purposes of illustration, embodiments are described below with a VSUPPLY of +15 volts relative to the voltage at source terminal 113.

As shown in FIG. 1, switch 144 may be coupled between the gate of JFET 102 and source terminal 113. In some embodiments, the switch 144 coupled between the gate of JFET 102 and the source terminal 113 may comprise a PMOS transistor. In other embodiments, switch 144 may comprise an NMOS transistor, or any other suitable switching device. Switch 144 may be configured to be responsive to the input signal IN. For example, a logic-high state of the input signal IN may drive switch 144 on, thereby coupling the gate of JFET 102 to source terminal 113. Accordingly, switch 144 may pull the JFET gate voltage JGATE down toward the voltage level of source terminal 113. As described above, JFET 102 may be a depletion mode device that is normally on with a gate-to-source voltage of zero volts. Thus, switch 144 may drive JFET 102 in a JFET on-state in response to the logic-high level (on-state) of the input signal IN. And as described directly below, MOSFET driver circuit 160 may also drive MOSFET 104 in a MOSFET on-state in response to the logic-high level (on-state) of the input signal IN.

MOSFET driver circuit 160 may include logic circuit 170 and driver 180. Logic circuit 170 may be configured to receive the JFET-drive signal JDRIVE and the comparison signal JGATE_COMP. Logic circuit 170 may include buffer 171, inverter 172, AND-gate 173, and latch 174. In some embodiments, latch 174 may be a set-reset latch. Buffer 171 may receive the JFET-drive signal JDRIVE and output a signal to the set-input of the latch 174. Thus, when JFET-drive signal JDRIVE is driven high by JFET driver 142 in response to a logic-high level (on-state) of the input signal IN, latch 174 may output a logic-high signal. Driver 180 may be coupled to drive the gate of MOSFET 104 in response to a logic-circuit output from latch 174. For example, in response to the logic-high signal from latch 174, driver 180 may output a high MOSFET-drive signal MDRIVE to drive MOSFET 104 in a MOSFET on-state. Thus, MOSFET driver circuit 160 may drive MOSFET 104 in a MOSFET on-state during an on-state of the input signal. In some embodiments, driver 180 may be supplied by the same VSUPPLY as JFET driver 142. In other embodiments, such as shown in FIG. 1, driver 180 may be supplied by a low-voltage supply VSUPPLY_LV that may have a voltage of, for example, +5 volts relative to the volage of source terminal 113, or any other voltage level suitable to drive MOSFET 104.

In sum, JFET 102 may be driven in a JFET on-state, and MOSFET 104 may be driven in a MOSFET on-state, in response to a logic-high level (on-state) of the input signal IN. Further, a voltage may be developed across the first terminal 121 and the second terminal 122 of capacitor 120. For example, in response to the logic-high level (on-state) of the input signal IN, switch 144 may hold the JFET-gate voltage JGATE at the second terminal 122 of capacitor 120 at the voltage level of source terminal 113. Meanwhile, JFET driver 142 may output a JFET-drive signal JDRIVE to the first terminal 121 of capacitor 120 at a level of, for example, +15 volts relative to the voltage at source terminal 113. As explained directly below, the voltage developed across capacitor 120 may be used to drive JFET 102 in an off-state in response to a subsequent logic-low level (off-state) of the input signal IN.

When the input signal IN transitions from a logic-high level (on-state) to a logic-low level (off-state), JFET driver 142 may output a low JFET-drive signal JDRIVE at the voltage level of source terminal 113. Further, in response to the logic-low level (off-state) of the input signal IN, switch 144 may turn off, thereby leaving the second terminal 122 of capacitor 120 and the gate of JFET 102 in a high-impedance state. Through the transition, capacitor 120 may maintain the relative +15 volts from first terminal 121 to second terminal 122. Thus, when JDRIVE at first terminal 121 transitions from +15 volts to zero volts relative to source terminal 113, capacitor 120 may force the JFET gate voltage JGATE at second terminal 122 to transition from zero volts to −15 volts relative to source terminal 113. As described above, JFET 102 may be a depletion-mode device with a gate-to-source threshold of, for example, −12 volts. Accordingly, the −15 volts applied by capacitor 120 to the gate of JFET 102 may drive JFET 102 in a JFET off-state. Drive circuit 140 together with capacitor 120 may thus directly drive JFET 102 in a JFET off-state in response to a logic-low level (off-state) of the input signal IN.

In some embodiments, the capacitance of capacitor 120 may be at least 10 nF, 20 nF, 40 nF, 100 nF, or more. Capacitor 120 may be sized, for example, to prevent the JFET gate voltage JGATE established by capacitor 120 from being significantly diminished due to the parasitic gate-to-drain capacitance or the parasitic gate-to-source capacitance. Thus, in some embodiments, the capacitance of capacitor 120 may be greater than a gate capacitance of JFET 102 by a factor of at least 10. For example, the capacitance of capacitor 120 may be greater than a gate capacitance of JFET 102 by a factor of 10, 20, 40, 100, or more.

Comparator 150 may be configured to compare the JFET gate voltage JGATE against a threshold VTH to generate a comparison signal JGATE_COMP. Comparator 150 may thus be utilized to provide an indication whether the JFET gate voltage JGATE is sufficient to drive JFET 102 in a JFET off-state when the input signal is at a logic-low level (off-state). As described in further detail below, MOSFET driver circuit 160 may drive MOSFET 104 in one of a MOSFET off-state and a MOSFET on-state in response to the comparison signal JGATE_COMP from comparator 150 during an off-state of the input signal IN. If the JFET gate voltage JGATE is sufficient to drive JFET 102 in a JFET off-state during an off-state of the input signal IN, MOSFET driver circuit 160 may leave MOSFET 104 in a MOSFET on-state to save switching losses. Conversely, if the JFET gate voltage JGATE is not sufficient to drive JFET 102 in a JFET off-state during an off-state of the input signal IN, MOSFET driver circuit 160 may drive MOSFET 104 in a MOSFET off-state to ensure that the conduction path of cascoded switch 110 as a whole is turned off.

As shown in FIG. 1, the reset-input to latch 174 may be coupled to the output of AND-gate 173. A first input of AND-gate 173 may be coupled to an output of inverter 172, which may invert the JFET-drive signal JDRIVE. Thus, when JDRIVE is low in response to a logic-low level (off-state) of the input signal IN, the first input to AND-gate 173 may be high. Under such conditions during the off-state of the input signal IN, AND-gate 173 may pass the comparison signal JGATE_COMP at the second input of AND-gate 173 to the output of AND-gate 173.

Comparator 150 may compare the JFET gate voltage JGATE against a threshold VTH. In some embodiments, the threshold of comparator 150 may be set at or close to, for example, −12 volts to match a −12 volt gate-to-source threshold voltage of JFET 102. In embodiments where JFET 102 has a different gate-to-source threshold voltage, the threshold of comparator 150 may be correspondingly adjusted. The comparison signal JGATE_COMP may thus provide an indication as to whether the JFET gate voltage JGATE is sufficient to drive JFET 102 in a JFET off-state when the input signal IN is at a logic-low level (off-state).

If the JFET gate voltage JGATE is −15 volts for example, and thus sufficiently below the example −12 volt threshold of JFET 102 to hold JFET 102 in a JFET off-state, comparator 150 may output a logic-low comparison signal JGATE_COMP. The output of AND-gate 173 may thus remain low, preventing the reset-input of latch 174 from being triggered. Driver 180 may thus maintain MOSFET 104 in a MOSFET on-state. Conversely, if the JFET gate voltage JGATE is at for example −11 volts and does not reach the −12 volt threshold, comparator 150 may output a logic-high comparison signal JGATE_COMP. The output of AND-gate 173 may thus go high, triggering the reset-input of latch 174. Latch 174 may accordingly output a low signal to driver 180, which may in turn drive MOSFET 104 in a MOSFET off-state.

In sum, MOSFET driver circuit 160 may be configured to drive MOSFET 104 in a MOSFET on-state during an off-state of the input signal IN in response to the comparison signal JGATE_COMP from comparator 150 indicating that the JFET gate voltage is sufficient to drive JFET 102 in a JFET off-state. MOSFET driver circuit 160 may also be configured to drive MOSFET 104 in a MOSFET off-state during an off-state of the input signal IN in response to the comparison signal JGATE_COMP from the comparator 150 indicating that the JFET gate voltage JGATE is not sufficient to drive the JFET in a JFET off-state.

The operation of cascoded switch system 100 described herein may provide cascoded switch system 100 with multiple advantages. First, by directly driving the gate of JFET 102, the parasitic gate-to-drain capacitance of JFET 102 may help slow the switching transitions of cascoded switch 110, thereby reducing the transient voltage spikes that may be incurred at the drain of cascoded switch 110 due to, for example, the switching of inductive loads. Moreover, by directly driving the gate of JFET 102, the turn-on and turn-off time of JFET 102 and cascoded switch 110 as a whole may be further controlled. For example, in some embodiments, cascoded switch system 100 may further comprise a resistor coupled in series between capacitor 120 and the gate of JFET 102. In such embodiments, the resistor may help slow the turn-on and turn-off speed of JFET 102 and cascoded switch 110 as a whole, thereby further reducing the transient voltage spikes that may be incurred at the drain of cascoded switch 110 due to, for example, the switching of inductive loads. In addition, the operation of cascoded switch system 100 as described herein may reduce switching losses while still maintaining safe operation of cascoded switch 110. For example, if the JFET gate voltage JGATE is sufficient to drive JFET 102 in a JFET off-state during an off-state of the input signal IN, MOSFET driver circuit 160 may leave MOSFET 104 in a MOSFET on-state to save switching losses that would otherwise be associated with driving the gate of MOSFET 104 high and low to turn MOSFET 104 on and off. Conversely, if the JFET gate voltage JGATE is not sufficient to drive JFET 102 in a JFET off-state during an off-state of the input signal IN, MOSFET driver circuit 160 may drive MOSFET 104 in a MOSFET off-state to ensure that the conduction path of cascoded switch 110 as a whole is turned off and thereby maintaining safe operation of cascoded switch 110.

Figure 2:
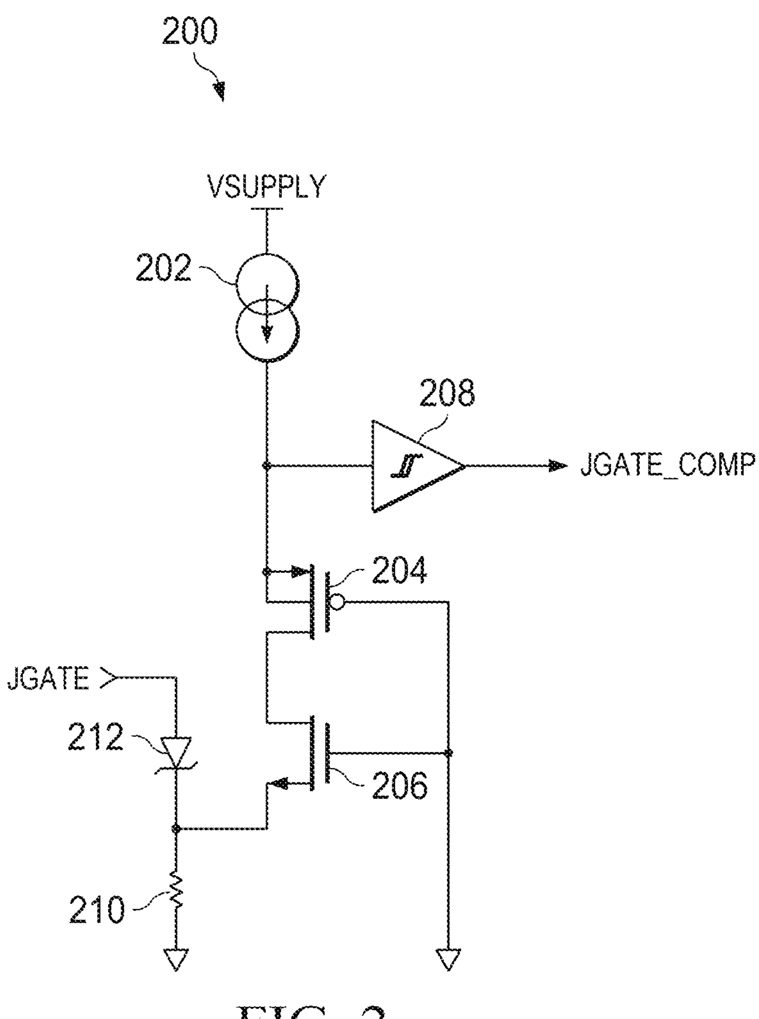
FIG. 2 illustrates a schematic diagram of an example comparator in accordance with embodiments of the present disclosure.

FIG. 2 illustrates a schematic diagram of comparator 200 in accordance with embodiments of the present disclosure. Comparator 200 may represent an embodiment of comparator 150 described above with reference to FIG. 1. As shown in FIG. 2, comparator 200 may include current source 202, transistor 204, transistor 206, buffer 208, resistor 210 and Zener diode 212.

Comparator 200 may be configured to compare the JFET gate voltage JGATE to a threshold. In the embodiment illustrated in FIG. 2, the reverse breakdown voltage of Zener diode 212 may provide the threshold against which the JFET gate voltage JGATE is compared.

Transistor 204 may be a P-type MOSFET ("PMOS") and transistor 206 may be an N-type MOSFET ("NMOS"). The source of transistor 204 may be coupled to receive a current from current source 202, and the drain of transistor 204 may be coupled to the drain of transistor 206. The source of transistor 206 may in turn be coupled to the intermediate node between Zener diode 212 and resistor 210. The gates of transistor 204 and transistor 206 may be tied low, for example to the source terminal 113 of cascoded switch system 100, which as described above with reference to FIG. 1, may serve as the low voltage rail for cascoded switch system 100.

When JGATE drops to a negative voltage below the negative breakdown of Zener diode 212, Zener diode 212 may pull the voltage at the source of transistor 206 low to a negative voltage, thereby turning on transistor 206. When transistor 206 turns on, transistor 204 and transistor 206 may sink the current from current source 202, lowering the voltage at the input of buffer 208. Buffer 208 may in turn output a logic-low comparison signal JGATE_COMP indicating that the JFET gate voltage JGATE is sufficient to drive JFET 102 in a JFET off-state.

If JGATE does not reach a negative voltage below the negative breakdown of Zener diode 212, Zener diode 212 will not conduct, and the voltage at the source of transistor 206 may match the voltage at the gate of transistor 206. Accordingly, transistor 206 may block the current from current source 202, causing the voltage at the input of buffer 208 to go high. Buffer 208 may in turn output a logic-high comparison signal JGATE_COMP indicating that the JFET gate voltage JGATE is not sufficient to drive JFET 102 in a JFET off-state.

Figure 3:
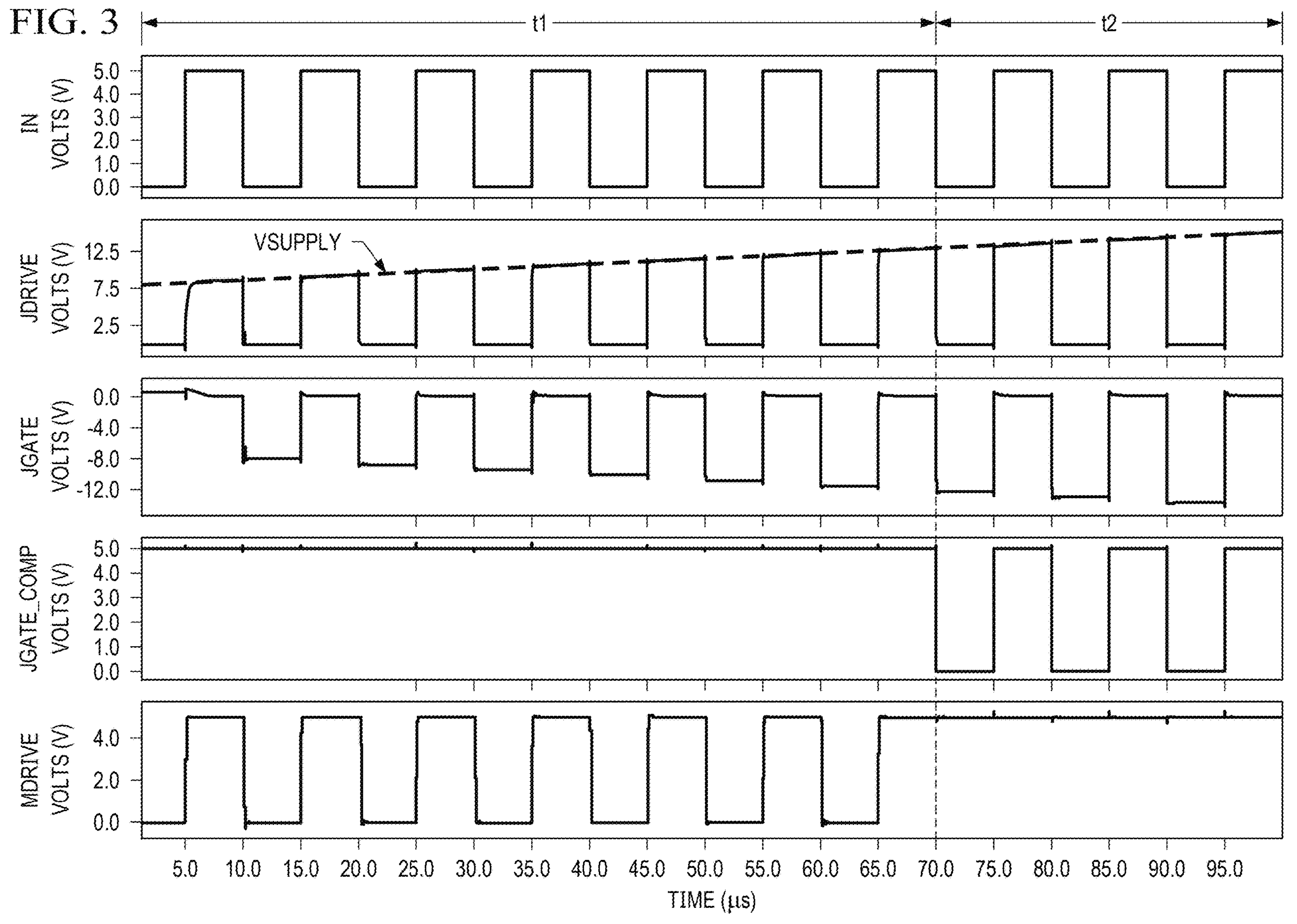
FIG. 3 illustrates a plot diagram of example waveforms within a cascoded switch system in accordance with embodiments of the present disclosure.

FIG. 3 illustrates a plot diagram of example waveforms within cascoded switch system 100 in accordance with embodiments of the present disclosure. Specifically, FIG. 3 illustrates how the JFET drive signal JDRIVE, the JFET gate voltage JGATE, the comparison signal JGATE_COMP, and the MOSFET drive signal MDRIVE respond to repeated cycles of the input signal IN as the supply voltage VSUPPLY increases over time. For simplicity, the waveforms in FIG. 3 illustrate the aforementioned signals in an example application where the cascoded switch system 100 is implemented as a low-side switch with the source terminal 113 of cascoded switch system 100 held to zero volts at ground.

As shown in FIG. 3, the input signal IN may cycle between a logic-high on-state and a logic-low off-state. When input signal is in a logic-high on-state, the JFET drive signal JDRIVE may be at a high voltage equal to the level of the voltage supply VSUPPLY, and the JFET gate voltage JGATE may be forced to zero volts. When the input signal IN transitions to a logic-low off-state, the JFET drive signal JDRIVE may be forced low to zero volts. As described above with reference to FIG. 1, capacitor 120 may maintain the voltage across first terminal 121 and second terminal 122 when the JFET drive signal JDRIVE transitions high to low. Thus, when the input signal IN transitions to a logic-low off-state, and the JFET drive signal JDRIVE transitions from a high voltage level equal to VSUPPLY to zero volts, capacitor 120 may force the JFET gate voltage JGATE to transition from zero volts to a negative voltage having the same magnitude as VSUPPLY.

As described above with reference to FIG. 1, comparator 150 may compare the JFET gate voltage JGATE against a threshold corresponding to the gate-to-source threshold of JFET 102. For example, the threshold of comparator 150 may be set to −12 volts to correspond to a −12 volt gate-to-source threshold of the depletion-mode JFET 102. Accordingly, the comparison signal JFET_COMP from comparator 150 may indicate whether the negative voltage applied to the gate of JFET 102 during an off-state of the input signal IN has a sufficient magnitude to drive JFET 102 in a JFET off-state.

During time t1 shown in FIG. 3, VSUPPLY may be less than +12 volts. Thus, the negative voltages applied by capacitor 120 to the gate of JFET 102 during the off-states of the input signal IN within time t1 may not have a sufficiently negative magnitude to drive JFET 102 in a JFET off-state. Comparator 150 may thus output a logic-high level comparison signal JGATE_COMP to indicate that the JFET gate voltage is not sufficient to drive JFET in an off-state throughout time t1. In response to the comparison signal JGATE_COMP, MOSFET driver circuit 160 may output a low MOSFET drive signal MDRIVE during each off-state of the input signal IN throughout time t1. MOSFET driver circuit 160 may thus drive MOSFET 104 in a MOSFET off-state during each off-state of the input signal IN throughout time t1. MOSFET driver circuit 160 may thus ensure that the conduction path of cascoded switched 110 is turned off during the off-state of the input signal IN, even when the supply voltage is insufficient to generate a sufficiently negative voltage to drive JFET 102 in an off-state.

Moving to time t2, the supply voltage VSUPPLY crosses +12 volts. Thus, the magnitude of the negative voltage applied by capacitor 120 to the gate of JFET 102 during the off-state of the input signal IN may cross the −12 volt threshold required to drive JFET 102 in an off-state. Thus, during time t2, JFET 102 may be cyclically driven on and off following the input signal IN. Further, during time t2, comparator 150 may output a logic-low comparison signal JGATE_COMP to indicate that the JFET gate voltage JGATE during the off-state of the input signal IN is sufficient to drive JFET 102 in a JFET off-state. In response to the comparison signal JGATE_COMP, MOSFET driver circuit 160 may maintain the MOSFET drive signal MDRIVE at a high level throughout time t2. MOSFET 104 may thus be driven in a MOSFET on-state throughout time t2. Because JFET 102 is cycling on and off in response to the input signal IN during time t2, it may not be necessary to also cycle MOSFET on and off. And by maintaining MOSFET 104 in an on-state throughout time t2, switching losses associated with turning on and off MOSFET 104 may be avoided thereby improving the efficiency of the system in which cascoded switch system 100 is implemented.

Figure 4:
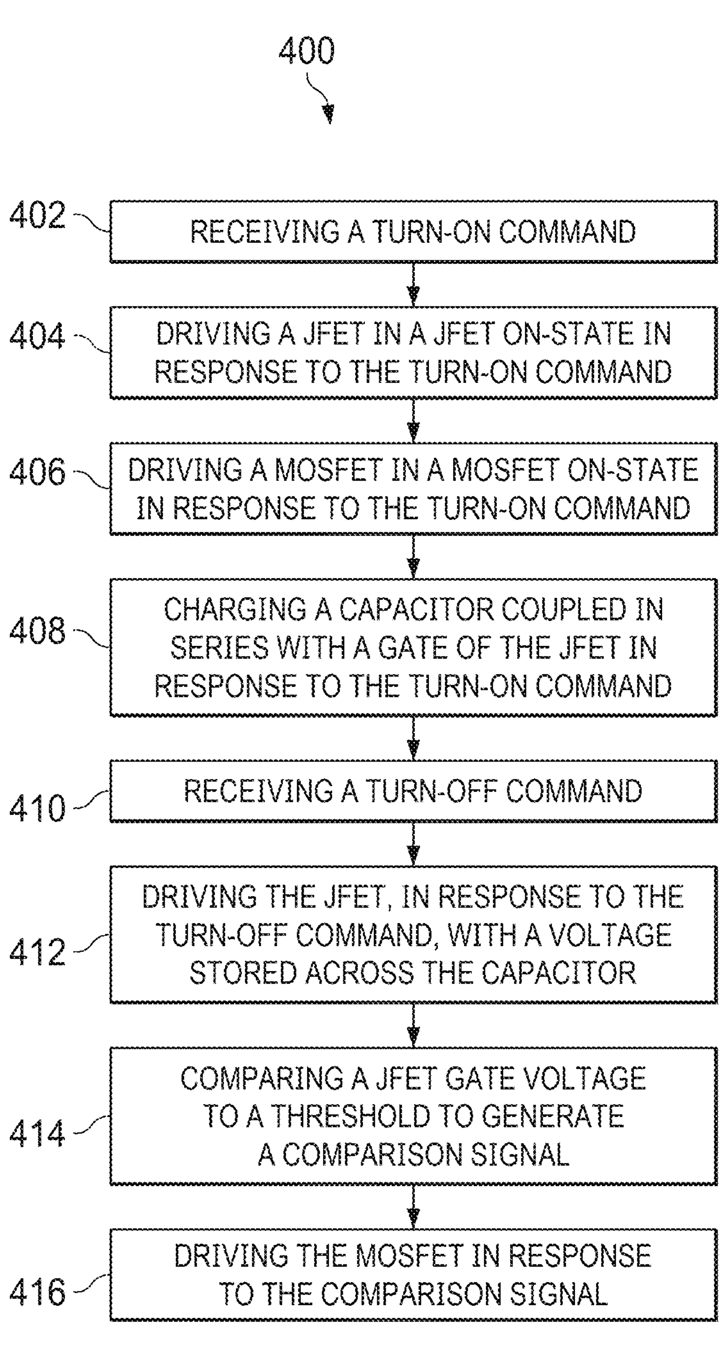
FIG. 4 illustrates operation of an example method in accordance with embodiments of the present disclosure.

FIG. 4 illustrates operation of an example method 400 of operating a cascoded switch system in accordance with embodiments of the present disclosure. Method 400 may be performed by any suitable mechanism, such as capacitor 120, drive circuit 140, JFET driver 142, switch 144, comparator 150, MOSFET driver circuit 160, and/or any suitable combination thereof. Method 400 may be performed with fewer or more steps than shown in FIG. 4. Moreover, steps of method 400 may be omitted, repeated, performed in parallel, performed in a different order than shown in FIG. 4, or performed recursively. One or more steps of method 400, although shown in an order, may be performed at the same time or in a re-ordered manner.

Step 402 may include receiving a turn-on command. For example, as described above with reference to FIG. 1, drive circuit 140 and JFET driver 142 in particular may receive an input signal IN. In some embodiments, the input signal IN may be a PWM input signal for turning on and off cascoded switch 110. As also described above with reference to FIG.

1, the logic-high level of the input signal IN may represent an on-state of the input signal or a turn-on command for turning on cascoded switch 110.

Step 404 may include driving a JFET in a JFET on-state in response to the turn-on command. As described above with reference to FIG. 1, JFET 102 may be a depletion mode device that is normally on at a gate-to-source voltage of zero volts. In response to a logic-high level of the input signal IN, switch 144 may couple the gate of JFET 102 to the source terminal of cascoded switch 110, thereby driving JFET 102 in a JFET on-state.

Step 406 may include driving a MOSFET in a MOSFET on-state in response to the turn-on command. For example, in response to the logic-high level of the input signal IN representing a turn-on command, JFET driver 142 may output a high JFET drive signal JDRIVE. As described above with reference to FIG. 1, MOSFET driver circuit 160 may receive the JFET drive signal JDRIVE. Specifically, a high JFET drive signal JDRIVE may set latch 174, thereby causing driver 180 to output a high MOSFET-drive signal MDRIVE to drive MOSFET 104 in a MOSFET on-state. Thus, MOSFET driver circuit 160 may drive MOSFET 104 in a MOSFET on-state in response to logic-high state of the input signal IN representing a turn-on command.

Step 408 may include charging a capacitor coupled in series with a gate of the JFET in response to the turn-on command. For example, as described above with reference to FIG. 1, and in response to the logic-high level of the input signal IN representing a turn-on command, switch 144 may couple the second terminal 122 of capacitor 120 to source terminal 113, while JFET driver 142 charges the first terminal 121 of capacitor 120 to a positive voltage of, for example, +15 volts relative to the voltage of source terminal 113.

Step 410 may include receiving a turn-off command. For example, as described above with reference to FIG. 1, drive circuit 140 and JFET driver 142 in particular may receive an input signal IN. In some embodiments, the input signal IN may be a PWM input signal for turning on and off cascoded switch 110. As also described above with reference to FIG. 1, the logic-low level of the input signal IN may represent an off-state of the input signal or a turn-off command for turning off cascoded switch 110.

Step 412 may include driving the JFET, in response to the turn-off command, with a voltage stored across the capacitor. For example, as described above with reference to FIG. 1, when the input signal IN transitions from a logic-high level (on-state) to a logic-low level (off-state), JFET driver 142 may output a low JFET-drive signal JDRIVE at the voltage level of source terminal 113. Further, switch 144 may turn off, thereby leaving the second terminal 122 of capacitor 120 and the gate of JFET 102 in a high-impedance state. Through the transition, capacitor 120 may maintain the relative +15 volts from first terminal 121 to second terminal 122. Thus, when JDRIVE at first terminal 121 transitions from +15 volts to zero volts relative to source terminal 113, capacitor 120 may force the JFET gate voltage JGATE at second terminal 122 to transition from zero volts to −15 volts relative to source terminal 113. In sum, JFET driver 142 and capacitor 120 may together drive the gate of JFET 102 at a negative voltage equal in magnitude to the positive voltage supplying JFET driver 142.

Step 414 may include comparing a JFET gate voltage to a threshold to generate a comparison signal. For example, as described above with reference to FIG. 1, comparator 150 may compare the JFET gate voltage JGATE to a threshold to generate a comparison signal JGATE_COMP. The threshold of comparator 150 may be configured to correspond to the gate-to-source threshold of JFET 102. Thus, the comparison signal JGATE_COMP may indicate whether the JFET gate voltage JGATE is sufficient to drive JFET 102 in a JFET off-state in response to the turn-off command.

Step 416 may include driving the MOSFET in response to the comparison signal. For example, as explained above with reference to FIG. 1, driving MOSFET 104 in response to the comparison signal JGATE_COMP may comprise driving MOSFET 104 in the MOSFET on-state in response to the comparison signal JGATE_COMP indicating that the JFET gate voltage JGATE is sufficient to drive JFET 102 in a JFET off-state. Alternatively, driving MOSFET 104 in response to the comparison signal JGATE_COMP may comprise driving MOSFET 104 in a MOSFET off-state in response to the comparison signal JGATE_COMP indicating that the JFET gate voltage JGATE is not sufficient to drive the JFET in a JFET off-state.

Although examples have been described above, other modifications and variations may be made from this disclosure without departing from the spirit and scope of these examples. The above descriptions of various embodiments illustrate the principles of the invention. Numerous variations and modifications will become apparent to those skilled in the art based on the above disclosure. The following claims are intended to embrace all such variations and modifications.

What is claimed is:

1. A cascoded switch system, comprising:

a cascoded switch comprising:
- a JFET coupled between a drain terminal and a cascode node of the cascoded switch; and
- a MOSFET coupled between the cascode node and a source terminal of the cascoded switch; and a drive circuit comprising:
- a JFET driver configured to receive an input signal and to output a JFET-drive signal to a capacitor coupled in series between the JFET driver and a gate of the JFET;
- a switch coupled between the gate of the JFET and the source terminal, the switch configured to be responsive to the input signal;
- a comparator configured to compare a JFET gate voltage against a threshold; and
- a MOSFET driver circuit configured to:
  - drive the MOSFET in a MOSFET on-state during an on-state of the input signal; and
  - drive the MOSFET in one of a MOSFET off-state and the MOSFET on-state in response to a comparison signal from the comparator during an off-state of the input signal.

2. The cascoded switch system of claim 1, wherein the MOSFET driver circuit is configured to drive the MOSFET in the MOSFET on-state during an off-state of the input signal in response to the comparison signal from the comparator indicating that the JFET gate voltage is sufficient to drive the JFET in a JFET off-state.

3. The cascoded switch system of claim 1, wherein the MOSFET driver circuit is configured to drive the MOSFET in the MOSFET off-state during an off-state of the input signal in response to the comparison signal from the comparator indicating that the JFET gate voltage is not sufficient to drive the JFET in a JFET off-state.

4. The cascoded switch system of claim 1, wherein a capacitance of the capacitor is greater than a gate capacitance of the JFET by a factor of at least 10.

5. The cascoded switch system of claim 1, wherein a capacitance of the capacitor is at least 10 nF.

6. The cascoded switch system of claim 1, further comprising a resistor coupled in series between the capacitor and the gate of the JFET.

7. The cascoded switch system of claim 1, wherein:
the JFET is a silicon carbide JFET; and
the MOSFET is a silicon MOSFET.

8. The cascoded switch system of claim 1, wherein the JFET, the MOSFET, and the drive circuit are co-packaged in a multi-die integrated circuit package.

9. The cascoded switch system of claim 1, wherein the switch coupled between the gate of the JFET and the source terminal comprises a PMOS transistor.

10. The cascoded switch system of claim 1, wherein the MOSFET driver circuit comprises:
a logic circuit configured to receive the JFET-drive signal and the comparison signal; and
a driver coupled to drive the gate of the MOSFET in response to a logic-circuit output.

11. A half-bridge circuit, comprising:
a first cascoded switch system forming an high-side switch of the half-bridge circuit; and
a second cascoded switch system forming a low-side switch of the half-bridge circuit; and
wherein each of the first cascoded switch system and the second cascoded switch system comprises:
a cascoded switch including:
a JFET coupled between a drain terminal and a cascode node of the cascoded switch; and
a MOSFET coupled between the cascode node and a source terminal of the cascoded switch; and
a drive circuit comprising:
a JFET driver configured to receive an input signal and to output a JFET-drive signal to a capacitor coupled in series between the JFET driver and a gate of the JFET;
a switch coupled between the gate of the JFET and the source terminal, the switch configured to be responsive to the input signal;
a comparator configured to compare a JFET gate voltage against a threshold; and
a MOSFET driver circuit configured to:
drive the MOSFET in a MOSFET on-state during an on-state of the input signal; and
drive the MOSFET in one of a MOSFET off-state and the MOSFET on-state in response to a comparison signal from the comparator during an off-state of the input signal.

12. The half-bridge circuit of claim 11, wherein the MOSFET driver circuit is configured to drive the MOSFET in the MOSFET on-state during an off-state of the input signal in response to the comparison signal from the comparator indicating that the JFET gate voltage is sufficient to drive the JFET in a JFET off-state.

13. The half-bridge circuit of claim 11, wherein the MOSFET driver circuit is configured to drive the MOSFET in the MOSFET off-state during an off-state of the input signal in response to the comparison signal from the comparator indicating that the JFET gate voltage is not sufficient to drive the JFET in a JFET off-state.

14. A method, comprising:
receiving a turn-on command;
driving a JFET in a JFET on-state in response to the turn-on command;
driving a MOSFET in a MOSFET on-state in response to the turn-on command;
charging a capacitor coupled in series with a gate of the JFET in response to the turn-on command;
receiving a turn-off command;
driving the JFET, in response to the turn-off command, with a voltage stored across the capacitor;
comparing a JFET gate voltage to a threshold to generate a comparison signal; and
driving the MOSFET in response to the comparison signal.

15. The method of claim 14, wherein driving the MOSFET in response to the comparison signal comprises driving the MOSFET in the MOSFET on-state in response to the comparison signal indicating that the JFET gate voltage is sufficient to drive the JFET in a JFET off-state.

16. The method of claim 14, wherein driving the MOSFET in response to the comparison signal comprises driving the MOSFET in a MOSFET off-state in response to the comparison signal indicating that the JFET gate voltage is not sufficient to drive the JFET in a JFET off-state.

17. The method of claim 14 wherein a capacitance of the capacitor is greater than a gate capacitance of the JFET by a factor of at least 10.

18. The method of claim 14, wherein a capacitance of the capacitor is at least 10 nF.

19. The method of claim 14, wherein:
the JFET is a silicon carbide JFET; and
the MOSFET is a silicon MOSFET.

20. The method of claim 14, wherein the JFET and the MOSFET are co-packaged in a multi-die integrated circuit package.

* * * * *